(12) United States Patent
Okita et al.

(10) Patent No.: US 7,872,286 B2
(45) Date of Patent: Jan. 18, 2011

(54) IMAGE PICKUP DEVICE, ITS CONTROL METHOD, AND CAMERA

(75) Inventors: Akira Okita, Yamato (JP); Toru Koizumi, Yokohama (JP); Isamu Ueno, Hadano (JP); Katsuhito Sakurai, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 681 days.

(21) Appl. No.: 11/326,416

(22) Filed: Jan. 6, 2006

(65) Prior Publication Data

US 2006/0157759 A1 Jul. 20, 2006

(30) Foreign Application Priority Data

Jan. 14, 2005 (JP) ............... 2005-008123

(51) Int. Cl.
*H01L 31/113* (2006.01)
(52) U.S. Cl. ............... 257/291; 257/E27.131
(58) Field of Classification Search ........... 257/291, 257/E27.131
See application file for complete search history.

(56) References Cited

U.S. PATENT DOCUMENTS

| | | | |
|---|---|---|---|
| 5,698,892 A | 12/1997 | Koizumi et al. ............... 257/620 |
| 6,064,431 A | 5/2000 | Ueno ............... 348/241 |
| 6,188,094 B1 | 2/2001 | Kochi et al. ............... 257/232 |
| 6,307,195 B1 * | 10/2001 | Guidash ............... 250/208.1 |
| 6,342,920 B2 | 1/2002 | Ueno ............... 348/303 |
| 6,605,850 B1 | 8/2003 | Kochi et al. ............... 257/431 |
| 6,670,990 B1 * | 12/2003 | Kochi et al. ............... 348/310 |
| 6,674,471 B1 | 1/2004 | Masuyama ............... 348/312 |
| 6,946,637 B2 | 9/2005 | Kochi et al. ............... 250/208.1 |
| 6,960,751 B2 | 11/2005 | Hiyama et al. ............... 250/208.1 |
| 7,016,089 B2 | 3/2006 | Yoneda et al. ............... 358/482 |
| 7,110,030 B1 | 9/2006 | Kochi et al. ............... 348/308 |
| 7,187,052 B2 | 3/2007 | Okita et al. ............... 257/444 |
| 2003/0164887 A1 | 9/2003 | Koizumi et al. ............... 348/308 |
| 2003/0218117 A1 * | 11/2003 | Hiyama et al. ............... 250/208.1 |
| 2004/0051801 A1 * | 3/2004 | Iizuka et al. ............... 348/294 |
| 2004/0239791 A1 | 12/2004 | Mabuchi ............... 348/315 |
| 2005/0122418 A1 | 6/2005 | Okita et al. ............... 348/340 |
| 2005/0168618 A1 | 8/2005 | Okita et al. ............... 348/335 |
| 2005/0174552 A1 | 8/2005 | Takada et al. ............... 355/53 |
| 2005/0179796 A1 | 8/2005 | Okita et al. ............... 348/308 |
| 2005/0185074 A1 | 8/2005 | Yoneda et al. ............... 348/294 |
| 2005/0268960 A1 | 12/2005 | Hiyama et al. ............... 136/244 |

(Continued)

FOREIGN PATENT DOCUMENTS

JP 11-355664 12/1999

(Continued)

*Primary Examiner*—Lynne A Gurley
*Assistant Examiner*—Colleen A Matthews
(74) *Attorney, Agent, or Firm*—Fitzpatrick, Cella, Harper & Scinto

(57) ABSTRACT

An image pickup device, wherein a part of the carriers overflowing from the photoelectric conversion unit for a period of photoelectrically generating and accumulating the carriers may be flowed into the floating diffusion region, and a pixel signal generating unit generating a pixel signal according to the carriers stored in the photoelectric conversion unit and the carriers having overflowed into the floating diffusion region, is provided. The expansion of a dynamic range and the improvement of an image quality can be provided by controlling a ratio of the carriers flowing into the floating diffusion region to the carriers overflowing from such a photoelectric conversion unit at high accuracy.

11 Claims, 7 Drawing Sheets

U.S. PATENT DOCUMENTS

| | | | |
|---|---|---|---|
| 2005/0269604 A1 | 12/2005 | Koizumi et al. | 257/291 |
| 2006/0027843 A1 | 2/2006 | Ogura et al. | 267/291 |
| 2006/0043261 A1 | 3/2006 | Matsuda et al. | 250/208.1 |
| 2006/0043393 A1 | 3/2006 | Okita et al. | 257/93 |
| 2006/0043439 A1 | 3/2006 | Koizumi | 257/291 |
| 2006/0044434 A1 | 3/2006 | Okita et al. | 348/294 |
| 2006/0158539 A1 | 7/2006 | Koizumi et al. | 348/300 |
| 2006/0158543 A1 | 7/2006 | Ueno et al. | 348/308 |
| 2006/0208161 A1 | 9/2006 | Okita et al. | 250/208.1 |
| 2006/0208291 A1 | 9/2006 | Koizumi et al. | 257/292 |
| 2006/0208292 A1 | 9/2006 | Itano et al. | 257/292 |
| 2006/0221667 A1 | 10/2006 | Ogura et al. | 365/149 |

FOREIGN PATENT DOCUMENTS

| | | |
|---|---|---|
| JP | 2001-186414 A | 7/2001 |
| JP | 2003-018471 A | 1/2003 |
| JP | 2004-111590 A | 4/2004 |
| JP | 2004-335803 | 11/2004 |

\* cited by examiner

IMAGE PICKUP DEVICE, ITS CONTROL METHOD, AND CAMERA

BACKGROUND OF THE INVENTION

1. Field of the Invention

The present invention relates to an image pickup device, its control method, and a camera.

2. Related Background Art

The specification of U.S. Pat. No. 6,307,195 discloses an image pickup device in which carriers having overflowed from a photodiode while photo carriers are being accumulated overflow into a floating diffusion (FD) region through a transfer gate (TG). In the image pickup device, a part of the carriers having flowed into the floating diffusion region is discarded for expanding the dynamic range of the device. Accordingly, the accumulation time of the floating diffusion region is set to be shorter than the accumulation time of the photodiode. In the configuration described above, it is stated that the dynamic range can be expanded by shortening the accumulation time of the floating diffusion region. However, all of the pieces of information of carriers which have flowed from the photodiode into the floating diffusion region for a period from the start of the accumulation time of the photodiode to the start of the accumulation time of the floating diffusion region are lost. Consequently, an image different from the image which a person actually viewed is picked up.

Moreover, Japanese Patent Application Laid-Open No. 2004-335803 discloses a MOS type image pickup device in which plural light receiving units are arranged on the surface of a semiconductor substrate in the shape of an array and the signal of each light receiving unit is read from each light receiving unit. The image pickup device includes a first signal carrier detection unit which detects incident light to output a signal according to the quantity of the detected incident light. Moreover, the image pickup device includes a second signal carrier detection unit which traps a part of excess carriers of the first signal carrier detection unit when the detection signal of the first signal carrier detection unit has saturated to output a signal according to the quantity of the trapped carriers.

As shown in Japanese Patent Application Laid-Open No. 2004-335803, the second signal carrier detection unit (38), which detects a part of saturated electrons generated in the first signal carrier detection unit (31) when the electrons have saturated, is independently formed. Moreover, the image pickup device has the structure of trapping a part of excess carriers to discard the residual carriers into a vertical overflow drain.

However, in order to discard a part of generated carriers to the vertical overflow drain and to collect the remainder to the second signal carrier detection unit (38), a technique of manufacturing the barrier unit (33) and the vertical overflow drain in a manner of having potential in very high accuracy is necessary. Because dispersion arises in each sample and an inflow rate changes when the accuracy is not adequate, the structure has a drawback of lacking mass productivity remarkably.

Moreover, because the structure is one in which the discharging side of carriers is the vertical overflow drain and the trapping side of carriers is a lateral overflow drain, the carriers are required to go over a barrier between the different structures. Consequently, the structure has a drawback such that the ratio of the carriers flowing out to the vertical overflow drain and the lateral overflow drain has temperature dependence.

SUMMARY OF THE INVENTION

An image pickup device according to the present invention includes: a photoelectric conversion unit generating carriers by photoelectric conversion to accumulate the carriers; a transfer transistor for transferring the carriers of the photoelectric conversion unit; a floating diffusion region into which the carriers are transferred by the transfer transistor; a transfer gate control unit controlling a gate voltage of the transfer transistor so that a part of the carriers overflowing from the photoelectric conversion unit for a period in which the photoelectric conversion unit is generating and accumulating the carriers may flow into the floating diffusion region; and a pixel signal generating unit generating a pixel signal according to the carriers accumulated in the photoelectric conversion unit and the part of the carriers having overflowed into the floating diffusion region.

An image pickup device according to the present invention includes: a photoelectric conversion unit generating carriers by photoelectric conversion to accumulate the carriers; a transfer transistor for transferring the carriers of the photoelectric conversion unit; a floating diffusion region into which the carriers are transferred by the transfer transistor; a transfer gate control unit controlling a gate voltage of the transfer transistor to be any of a first gate voltage at which the transfer transistor is turned on, a second gate voltage at which the transfer transistor is turned off, and a third gate voltage between the first and the second gate voltages; and a pixel signal generating unit generating a pixel signal according to the carriers transferred into the floating diffusion region in a period in which the gate voltage is controlled to be the first gate voltage and the third gate voltage.

An image pickup device according to the present invention includes: a photoelectric conversion unit generating carriers by photoelectric conversion to accumulate the carriers; a transfer transistor for transferring the carriers of the photoelectric conversion unit; a floating diffusion region into which the carriers are transferred by the transfer transistor; a transfer gate control unit controlling a gate voltage of the transfer transistor so that a part of the carriers overflowing from the photoelectric conversion unit for a period in which the photoelectric conversion unit is generating and accumulating the carriers may flow into the floating diffusion region; and a pixel signal generating unit generating a pixel signal according to the carriers accumulated in the photoelectric conversion unit and the part of the carriers having overflowed into the floating diffusion region.

Moreover, a control method of an image pickup device according to the present invention is a control method of an image pickup device provided with a photoelectric conversion unit generating carriers by photoelectric conversion to accumulate the carriers, a transfer transistor for transferring a signal of the photoelectric conversion unit, and a floating diffusion region into which the carriers are transferred by the transfer transistor, the method comprising: a transfer gate control step of controlling a gate voltage of the transfer transistor so that a part of the carriers overflowing from the photoelectric conversion unit for a period in which the photoelectric conversion unit is generating and accumulating carriers may flow into the floating diffusion region; and a pixel signal generating step of generating a pixel signal according to the carriers accumulated in the photoelectric conversion unit and the part of the carriers having overflowed into the floating diffusion region.

Moreover, a camera according to the present invention includes: the image pickup device described above; a lens for focusing an optical image on the image pickup device; and a diaphragm for changing a light quantity passing through the lens.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

First Embodiment

Figure 1:
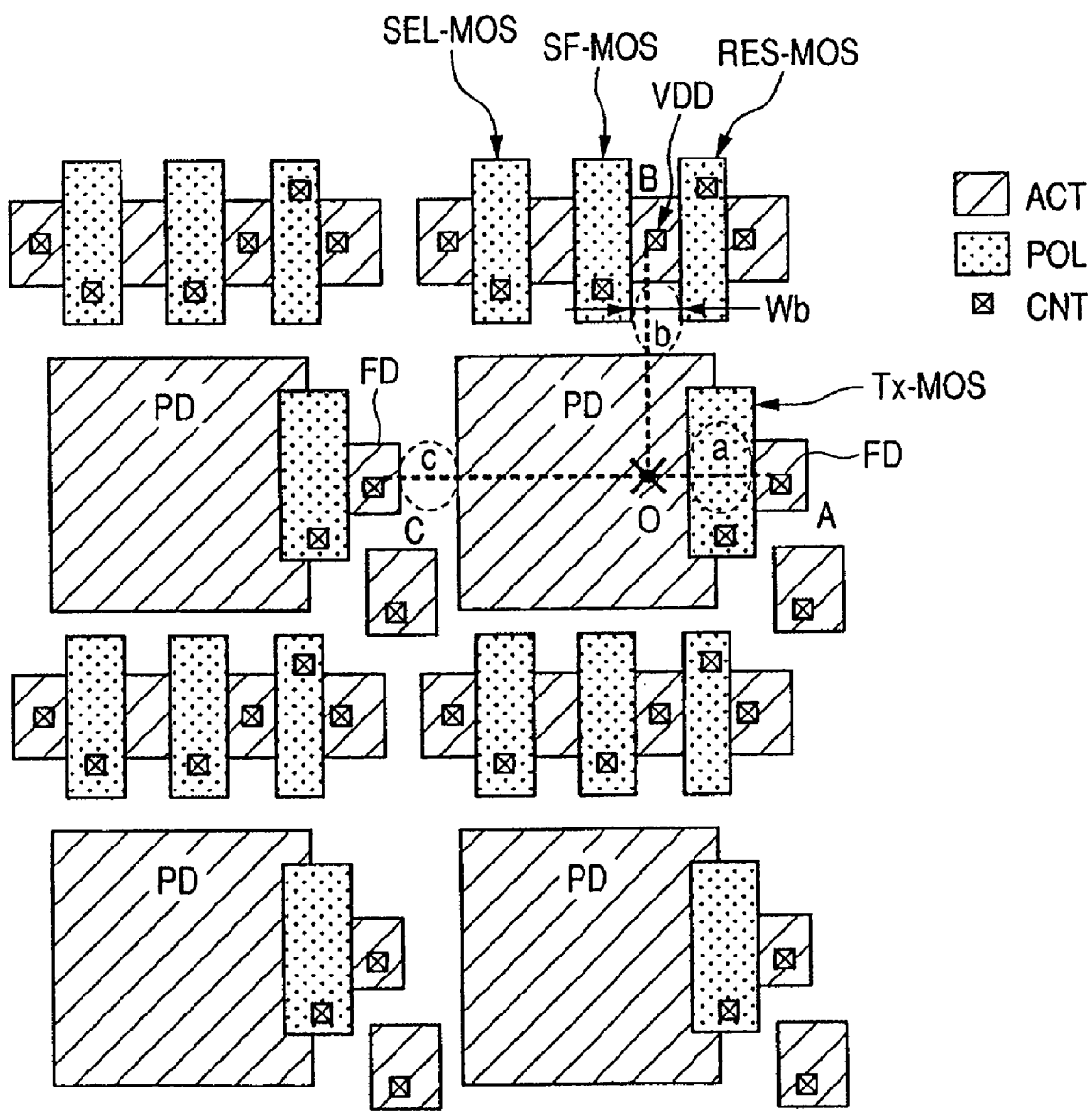
FIG. 1 is a layout chart showing a configuration example of pixel units of an image pickup device according to a first embodiment of the present invention.
Figure 2:
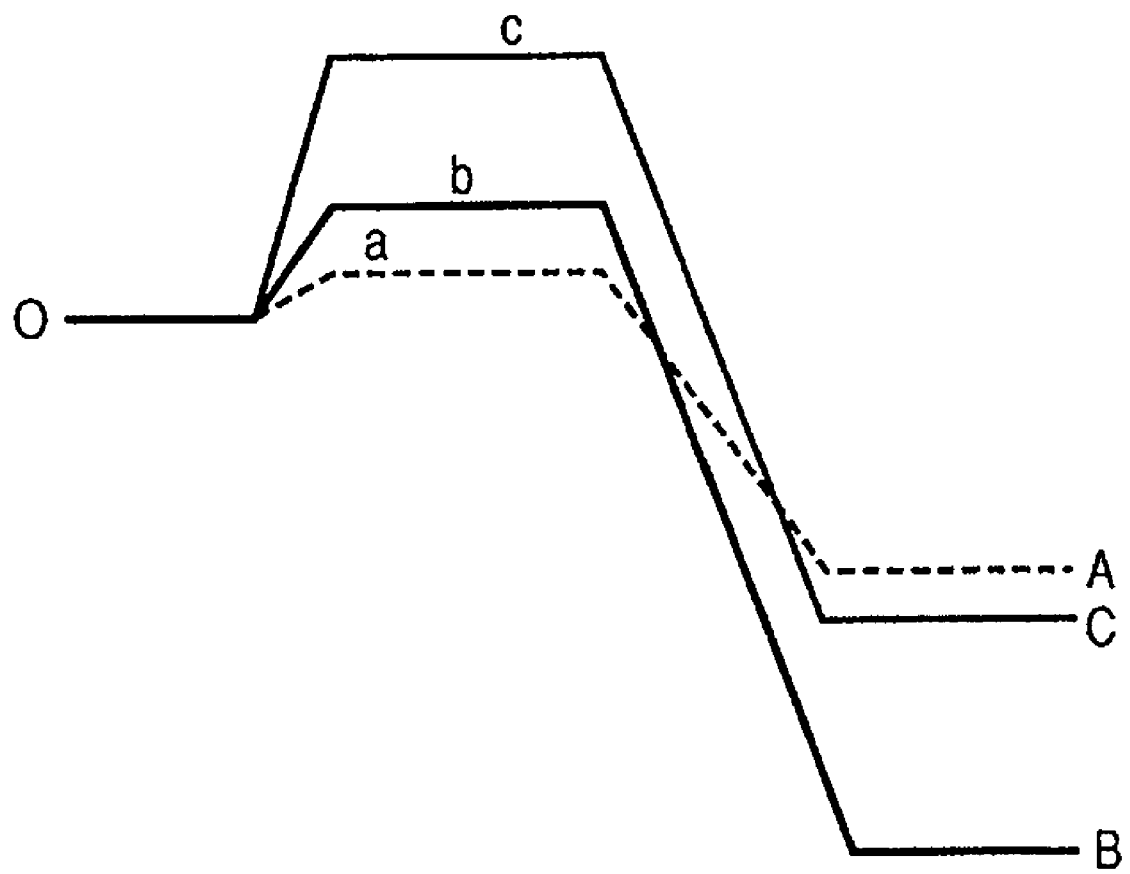
FIG. 2 is a potential diagram of the cross sections taken along an O-A line, an O-B line and an O-C line in FIG. 1 during a carrier storing period.

FIG. 1 is a layout chart showing a configuration example of pixel units of an image pickup device according to a first embodiment of the present invention, and FIG. 2 is a potential diagram of the cross sections taken along an O-A line, an O-B line and an O-C line in FIG. 1 during a carrier storing period. In the following, an n-channel MOS field effect transistor is simply referred to as a MOS transistor. In the image pickup device, plural pixels are two-dimensionally arranged. FIG. 1 is a plan view showing arranged four pixels as an example. One pixel includes a transfer MOS transistor Tx-MOS and a reset MOS transistor RES-MOS. Furthermore, the pixel includes a source follower MOS transistor SF-MOS and a selection MOS transistor SEL-MOS. A photo-diode PD and a floating diffusion region FD correspond to a source and a drain of the transfer MOS transistor Tx-MOS, respectively. A drain B of the transistor RES-MOS is connected to a fixed power source voltage VDD.

The photodiode PD, which functions as a photoelectric conversion unit, generates carriers by photoelectric conversion, and stores the generated carriers. A gate of the transfer MOS transistor Tx-MOS is a gate for transferring the carriers generated by the photodiode PD to the floating diffusion region FD, which is a diffusion region. By closing the transfer gate (by turning off the transistor Tx-MOS), the photodiode PD can generate and stored carriers by photoelectric conversion. When the accumulation time ends, the carriers stored in the photodiode PD can be transferred (read) to the floating diffusion region FD by opening the transfer gate (by turning on the transistor Tx-MOS).

In FIG. 2, a region a denoted by the O-A line indicates the potential between the photodiode PD and the floating diffusion region FD (i.e. the potential under the gate of the transistor Tx-MOS). A point O denotes the potential of the photodiode PD, and a point A denotes the potential of the floating diffusion region FD of the same pixel as that of the photodiode PD.

Similarly, in FIG. 2, a region b denoted by the O-B line indicates the potential between the photodiode PD and the drain B of the transistor RES-MOS. A point B indicates the drain B of the transistor RES-MOS.

A region c denotes by the O-C line of FIG. 2 indicates the potential between the photodiode PD of a certain pixel and another pixel adjoining to the photodiode PD. A point C denotes the potential of the floating diffusion region FD of the adjoining pixel.

Here, potential is one of the barriers. One of the methods of controlling a barrier is controlling potential. The potential is controllable by an impurity density or a gate voltage.

The height of the potential enclosing the photodiode PD is the same height as that of the region c except for the regions a and b. The potential of the region b is made lower than the potential of region c. The photodiode PD includes an n-type region storing electrons as carriers. The regions b and c are p+ type regions. As described above, the potential of these regions can be controlled by adjusting the impurity density. On the other hand, the potential of the region a can be changed by controlling the potential of the transfer gate of the transistor Tx-MOS. For a period in which the photodiode PD is generating and storing the carriers, the potential of the region a is made to have the same height as that of the potential of the region b. The potential of the regions a and b are controlled to be the lowest among the barriers enclosing the photodiode PD. Moreover, the potential of each of the regions a and b may be controlled independently.

The quantity of the carriers which the photodiode PD can store is determined. Consequently, when strong light is radiated to the photodiode PD, carriers overflow from the photodiode PD. The carriers having overflowed from the photodiode PD flow, being divided into the floating diffusion region FD and the drain B of the transistor RES-MOS. That is, a part of the carriers flows into the floating diffusion region FD, and the other part of the carriers is ejected to the drain B of the transistor RES-MOS.

In the present embodiment, a part of the overflowed carriers can be gathered into the floating diffusion region FD at a certain fixed ratio. The carriers having overflowed from the photodiode PD flows into the floating diffusion region FD at the point A through the region a having the lowest potential. By controlling the potential in the region a to become the same as the potential in the region b, the carriers having overflowed from the photodiode D can be distributed to the regions a and b at the same ratio. Moreover, the region b is preferably the fixed power source voltage VDD. The reason is that the carriers having flowed into the drain B can be processed promptly.

The region c is the floating diffusion region FD of the adjoining pixel. The region c forming the barrier of this part requires higher potential compared with the potential of the region b. The reason is that the leakage of the carriers into the adjoining pixel region can be suppressed by such a measure.

The ratio of the distribution the carriers flowing into the regions of a and b may be controlled by the ratio of the gate width W of transfer MOS transistor Tx-MOS and the width Wb of the region b. Moreover, by controlling the gate voltage of the transfer MOS transistor Tx-MOS so as to be a desired ratio of the distribution of the carriers, the distribution of the carriers can be performed by a stable ratio. And it becomes possible to attain the expansion of the dynamic range. For example, it is also possible to make 10% of the carriers having overflowed from the photodiode PD flow into the carriers flow into the drain B.

That is, it is possible to control the ratio of the carriers to be discarded and signal carriers with higher accuracy compared with that of the related art disclosed in Japanese Patent Application Laid-Open No. 2004-335803. Furthermore, in the present embodiment, because the mutual structures of regions a and b are the same lateral direction overflow drains, temperature dependence is small, and even if a change of the ratio arises, the ratio can be maintained at a fixed value by controlling the potential.

Figure 3:
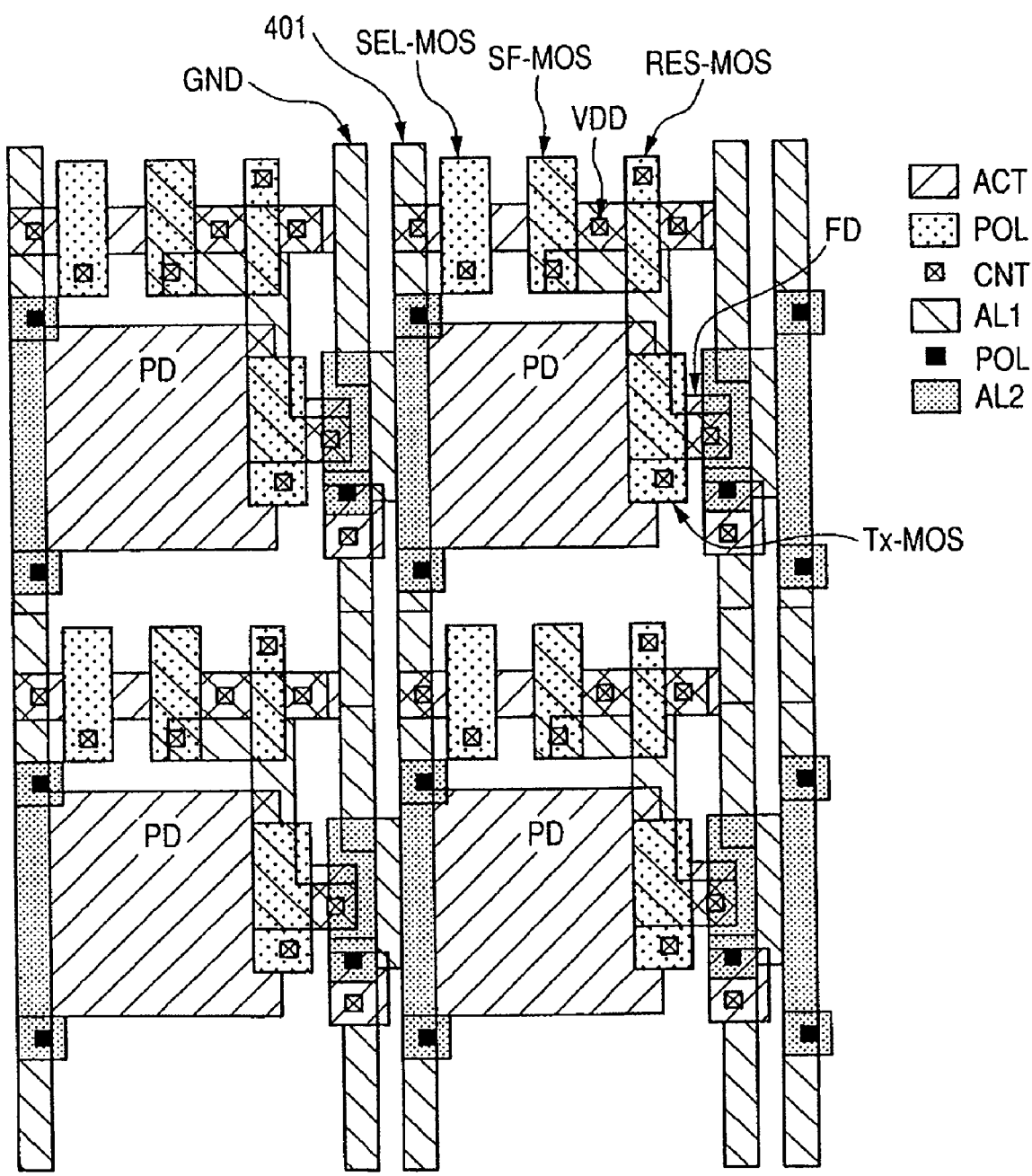
FIG. 3 is a layout chart showing an example of the whole configuration of the image pickup device according to the present embodiment.
Figure 4:
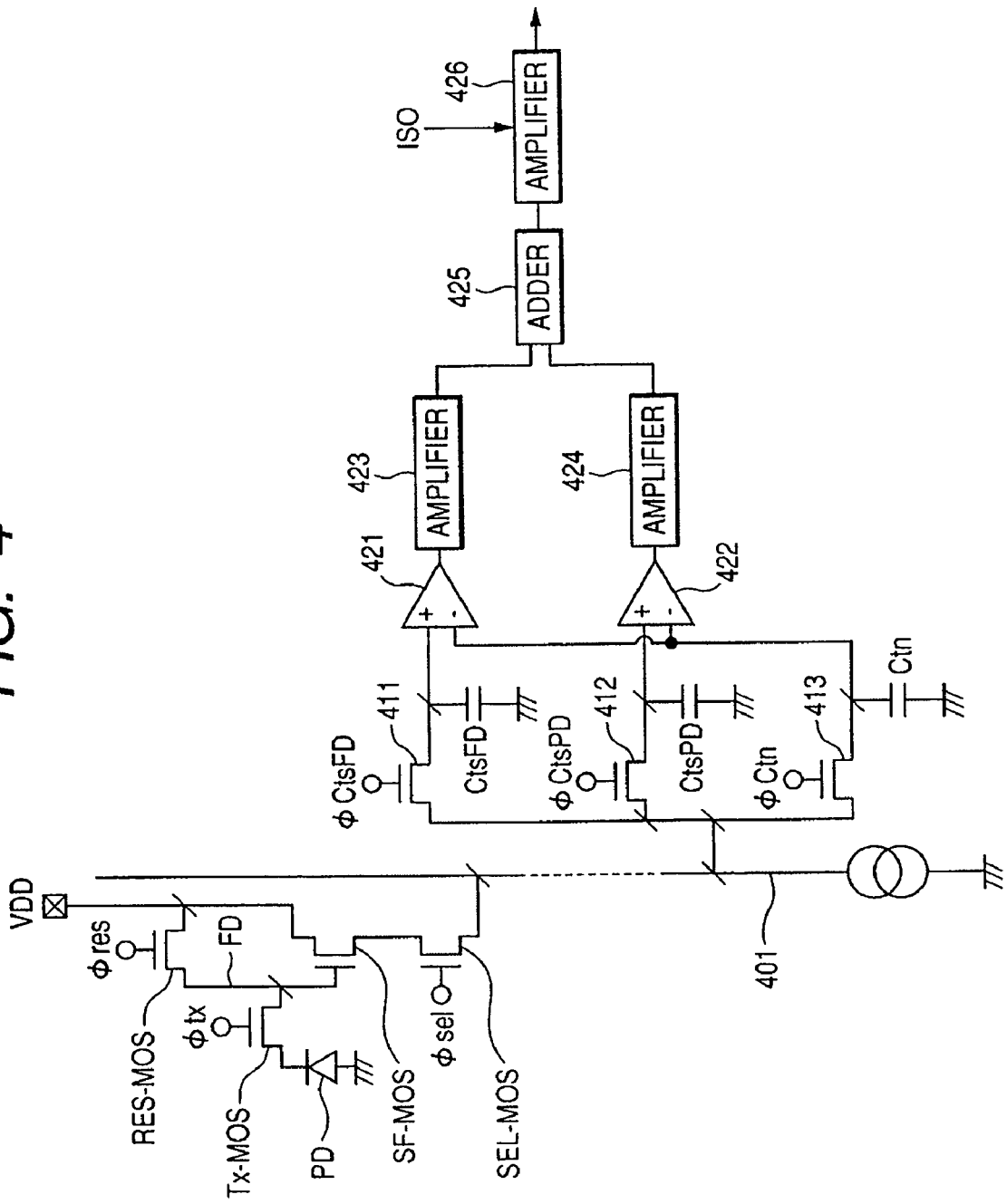
FIG. 4 is an equivalent circuit diagram of the image pickup device of FIG. 3.

FIG. 3 is a layout chart showing an example of the whole configuration of the image pickup device according to the present embodiment, and FIG. 4 is an equivalent circuit diagram showing a certain pixel of the image pickup device of FIG. 3. In FIG. 4, the floating diffusion region FD is connected with the drain of the transfer MOS transistor Tx-MOS, the source of the reset MOS transistor RES-MOS, and the gate of the source follower MOS transistor.

Figure 5:
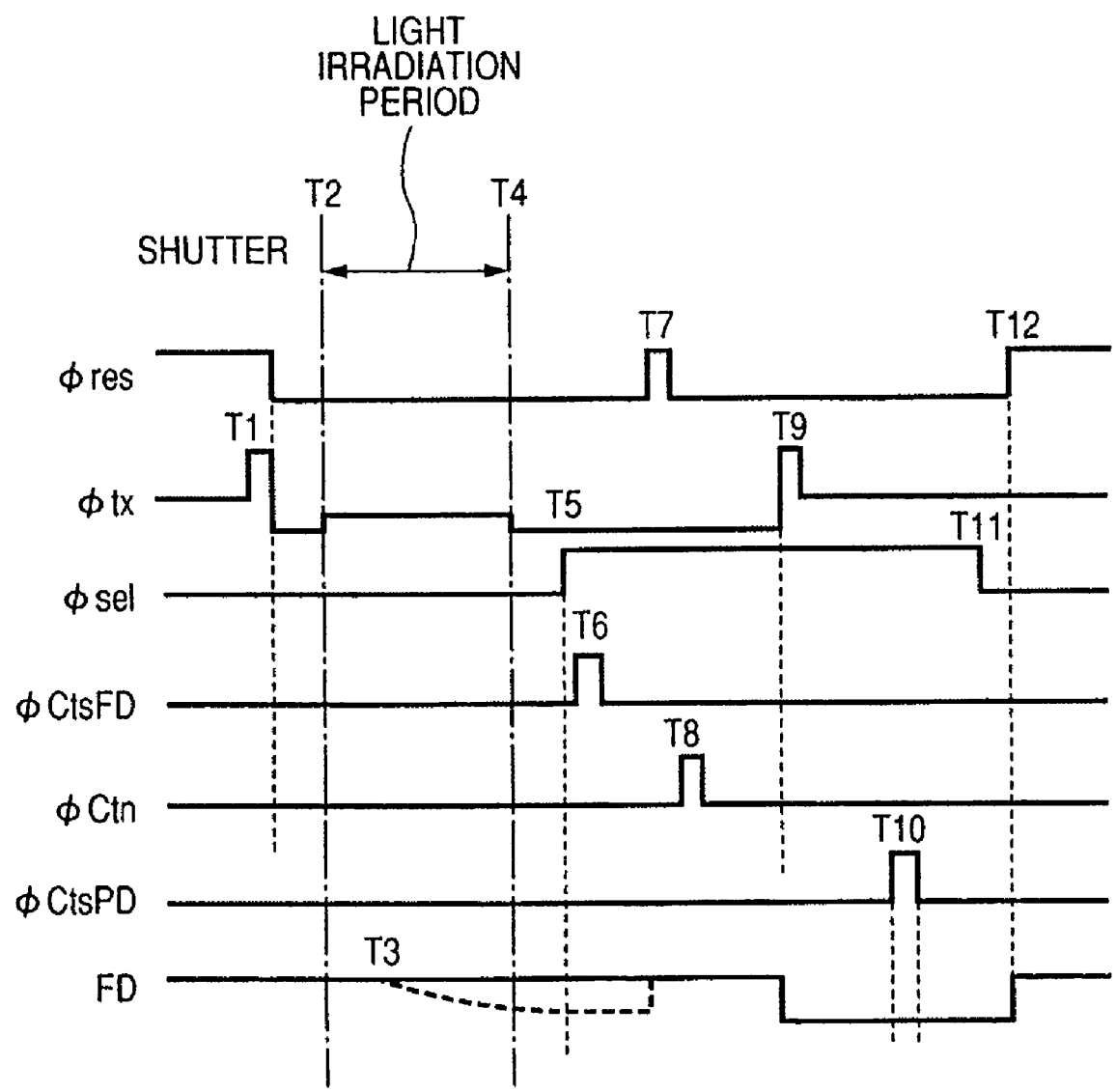
FIG. 5 is a timing chart showing an operation example of the circuit of FIG. 4.

FIG. 5 is a timing chart showing an operation example of the circuit of FIG. 4. Potential φres indicates the gate voltage of the reset MOS transistor RES-MOS; potential φtx indicates the gate voltage of the transfer MOS transistor Tx-MOS; potential φsel indicates the gate voltage of the selection MOS transistor SEL-MOS; potential φCtsFD indicates the gate voltage of a MOS transistor 411; potential φCtn indicates the gate voltage of a MOS transistor 413; and potential φCtsPD indicates the gate voltage of a MOS transistor 412.

Before timing T1, the potential φres is positive potential, and the potential φtx, φsel, φCtsFD, φCtn and φCtsPD are 0 V. The reset MOS transistor RES-MOS is turned on, and the power source voltage VDD is supplied to the floating diffusion region FD.

Next, a positive pulse is applied as the potential φtx. The transistor Tx-MOS is turned on, and the power source voltage VDD is applied to the floating diffusion region FD and the photodiode PD. Then, the floating diffusion region FD and the photodiode PD are reset. After the reset, the potential φres is lowered to 0 V, and the reset MOS transistor RES-MOS is turned off. Then, the potential φtx is set to, for example, −1.3 V, and the potential of the region a is made to be higher than the potential of the region b. Thus, the photodiode PD and the floating diffusion region FD are made to be in a floating state. However, an external mechanical shutter is not opened yet at this time, and the accumulation of photo carriers is not started in the photodiode PD.

Next, at timing T2, a mechanical shutter 53 (FIG. 6) opens, and light is radiated to the photodiode PD. Then, the photodiode PD starts generating and storing photo carriers. At this time, the potential φtx is raised to, for example, 0.7 V which is a value between a positive pulse applied at a timing T1 and a voltage −1.3 V applied thereafter. And the potential of the region a is made to be the same height as that of the potential of the region b. Moreover, the potential φtx may be controlled to set the potential of the region a independently of the potential of the region b in case of some values of the ratio of the carriers having overflowed into the floating diffusion region FD.

Next, the dotted line of the potential of the floating diffusion region FD at timing T3 indicates the potential when strong light is radiated. At the timing T3, the photodiode PD saturates, and a part of the negative carriers of the photodiode PD flows from the photodiode PD into the floating diffusion region FD. Thereby, the potential of the floating diffusion region FD lowers. A part of the carriers having overflowed from the photodiode PD flows into the floating diffusion region FD at a certain ratio, and the remainder is ejected by the power source voltage VDD of the drain B. Incidentally, the solid line of the potential of the floating diffusion region FD indicates a case where weak light is radiated and the carriers do not overflow from the photodiode PD into the floating diffusion region FD.

Next, at timing T4, the shutter 53 closes, and the photodiode PD is shielded from the light. Then, the generation of the photo carriers of the photodiode PD ends. And the potential φtx is lowered to, for example, −1.3 V, and the potential of the region a is made to be higher than the potential of region b. Thus, the photodiode PD and the floating diffusion region FD are made to be in a floating state. Because the inflow of the photo carriers of the photodiode PD into the floating diffusion region FD stops at this time point, the potential of the floating diffusion region FD is maintained in this state.

Next, the potential φsel is made from 0 V to positive potential at timing T5. The selection MOS transistor SEL-MOS is turned on, and makes a signal output line 401 be in an active state. The source follower MOS transistor SF-MOS constitutes a source follower amplifier, and outputs a voltage to the signal output line 401 according to the potential of the floating diffusion region FD.

Next, at timing T6, a positive pulse is applied as the potential φCtsFD. A transistor 411 is turned on, and the output according to the potential of the floating diffusion region FD is stored in capacity CtsFD. Because carriers do not overflow into the floating diffusion region FD in a pixel in which the photodiode PD is not saturated, the output according to the power source voltage VDD, which resets the floating diffusion region FD, is stored in the capacity CtsFD. Moreover, when strong light has been radiated to the photodiode PD and the photodiode PD has saturated, an output voltage lower than the power source voltage VDD, which resets the floating diffusion region FD, is stored in capacity CtsFD.

Next, at timing T7, a positive pulse is applied as the potential φres. The reset MOS transistor RES-MOS is turned on, and the floating diffusion region FD is again reset by the power source voltage VDD.

Next, at timing T8, a positive pulse is applied as the potential φCtn. The MOS transistor 413 is turned on, and an offset noise voltage in the state in which the floating diffusion region FD is reset is stored in capacity Ctn.

Next, at timing T9, a positive pulse is applied as potential φtx. The transfer MOS transistor Tx-MOS is turned on, and the carriers stored in the photodiode PD is read into the floating diffusion region FD.

Next, at timing T10, a positive pulse is applied as the potential φCtsPD. The MOS transistor 412 is turned on, and the voltage of the signal output line 401 according to the carriers having been read from the photodiode PD into the floating diffusion region FD is stored in capacity CtsPD.

Next, at timing T11, the potential φsel is made to be 0 V. The selection MOS transistor SEL-MOS is turned off, and the signal output line 401 becomes in an inactive state.

Next, at timing T12, the potential φres is changed to be positive potential. The reset MOS transistor RES-MOS is turned on, and the potential of the floating diffusion region FD is fixed to the power source voltage VDD.

By the processing described above, the voltage corresponding to offset noises is stored in the capacity Ctn; the voltage corresponding to the carriers having overflowed from photodiode PD into the floating diffusion region FD is stored in the capacity CtsFD; and the voltage corresponding to the accumulated carriers of the photodiode PD is stored in the capacity CtsPD.

A differential amplifier 421 outputs a voltage generated by subtracting the noise voltage of the capacity Ctn from the signal voltage of the capacity CtsFD. A differential amplifier 422 outputs a voltage generated by subtracting the noise voltage of the capacity Ctn from the signal voltage of the capacity CtsPD. An amplifier 423 amplifies the output signal of the differential amplifier 421. An amplifier 424 amplifies the output signal of the differential amplifier 422.

The amplification degrees (gains) of the amplifiers 423 and 424 are determined by the ratio of the quantity of the carriers having flowed into the floating diffusion region FD and the quantity of the carriers having flowed into the drain B among the carriers having overflowed from the photodiode PD. For example, a case is described in which 10% of the carriers having overflowed from the photodiode PD flows into the floating diffusion region FD and 90% of the carriers flows into the drain B. In that case, the amplifier 423 amplifies the input signal ten times to output the amplified input signal, and the amplifier 424 amplifies an input signal one time to output the amplified input signal. That is, that case means that 10 times of the quantity of the carriers having overflowed into the floating diffusion region FD is the quantity of the carriers having overflowed from the photodiode PD.

An adder 425 adds the output signals of the amplifiers 423 and 424 to output the added signal as a pixel signal. Accordingly, the adder 425 operates as a pixel signal generating unit. Because the pixel signal is generated based on the carriers stored in the photodiode PD and the carriers having overflowed into the floating diffusion region FD, the dynamic range of the pixel signal can be more expanded compared with the case where only the carriers stored in the photodiode PD are used. And, the pixel signal or image signal may be generated based on only the carriers having overflowed into the floating diffusion region FD.

An amplifier 426 amplifies and outputs the output signal of the adder 425 according to ISO speed. When the ISO speed is fixed at small number, the amplification degree is small, and when the ISO speed is fixed at large number, the amplification degree is large.

Moreover, in FIG. 2, when the ISO speed is fixed at 100, the potential of the region a may be controlled to be the same height as that of the potential of the region b, and when the ISO speed is fixed at 200 or more, the height of the potential of the region a may be controlled to become higher than that of the potential of the region b. Moreover, in FIG. 5, when the ISO speed is fixed at 100, the potential $\phi tx$ is controlled so that the height in the period from the timing T2 to T4 may become higher than the heights before the timing T2 and after the timing T4. On the other hand, when the ISO speed is fixed at 200 or more, the potential $\phi tx$ is controlled so that the height of the period from the timing T2 to T4 may become the same as those before the timing T2 and after the timing T4.

In other words, when the ISO speed is fixed at 100, the potential of the region a is controlled so that the height in the period from the timing T2 to T4 may become lower than the heights before the timing T2 and after the timing T4. On the other hand, when the ISO speed is fixed at 200 or more, the potential of the region a is controlled so that the height in the period from the timing T2 to T4 may become the same as those before the timing T2 and after the timing T4.

As described above, the potential $\phi tx$ of the transfer gate in the period from the timing T2 to T4, in which the photodiode PD is generating and storing carriers, is controlled according to the amplification degree of the pixel signal corresponding to the ISO speed.

Second Embodiment

Figure 6:
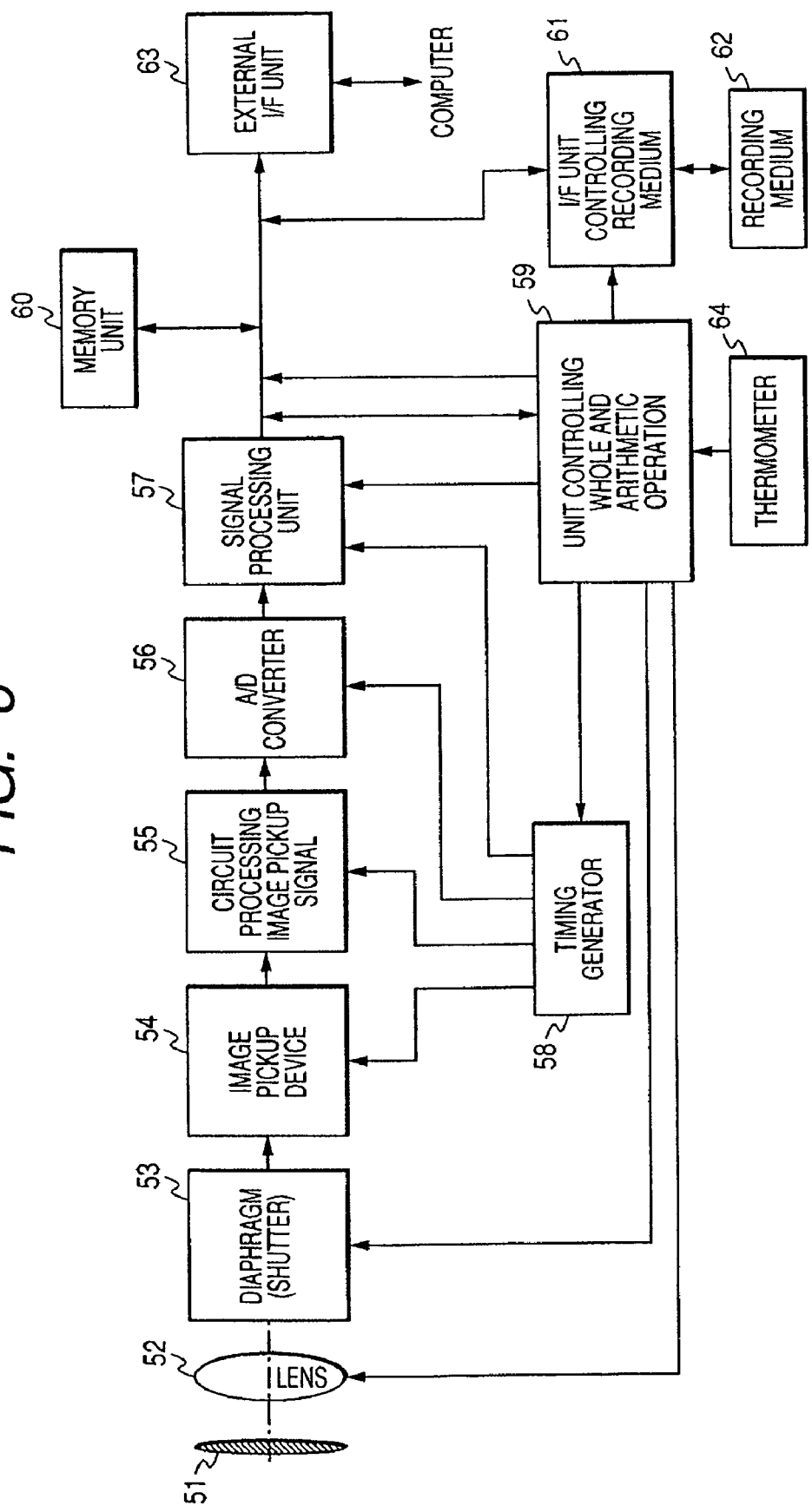
FIG. 6 a block diagram showing a configuration example of a still video camera according to a second embodiment of the present invention.

FIG. 6 is a block diagram showing a configuration example of a still video camera according to a second embodiment of the present invention. Based on FIG. 6, an example at the time of applying the image pickup device of the first embodiment to the still video camera is described in full detail. An image pickup device 54 and a circuit 55 processing an image pickup signal correspond to the above image pickup device.

In FIG. 6, a reference numeral 51 denotes a barrier used as a protector and a main switch of a lens commonly. A reference numeral 52 denotes a lens focusing an optical image of a subject on the image pickup device 54. A reference numeral 53 denotes a diaphragm and shutter for changing the quantity of the light having passed through the lens 52. And the reference numeral 54 denotes the image pickup device for capturing the subject focused by the lens 52 as an image signal. The reference numeral 55 denotes the circuit for processing an image pickup signal which performs the analog signal processing of the image pickup signal (image signal) output from the image pickup device 54. Furthermore, a reference numeral 56 denotes an A/D converter performing the analog-to-digital conversion of the image signal output from the circuit 55 processing the image pickup signal. Moreover, a reference numeral 57 denotes a signal processing unit performing various corrections and data compression of image data output from the A/D converter 56. A reference numeral 58 denotes a timing generator outputting various timing signals to the image pickup device 54, the circuit 55 processing the image pickup signal, the A/D converter 56 and the signal processing unit 57. A reference numeral 59 denotes a unit controlling the whole and arithmetic operations which controls various arithmetic operations and the whole still video camera. A reference numeral 60 denotes a memory unit for storing image data temporarily. A reference numeral 61 denotes an interface unit for performing the recording or the reading of a recording medium 62. The reference numeral 62 denotes the recording medium capable of attaching and detaching semiconductor memories or the like for performing the recording or the reading of image data. A reference numeral 63 denotes an interface unit for communicating with an external computer and the like.

Here, the image pickup device, and the timing generator 58 and the like may be formed in the same chip.

Next, the operation of the still video camera at the time of photographing in the configuration mentioned above is described. When the barrier 51 is opened, a main power source is turned on, and then the power source of a control system is turned on. Furthermore, the power source of image pickup system circuits such as the A/D converter 56 is turned on. And in order to control light exposure, the unit 59 controlling the whole and arithmetic operations releases the diaphragm (shutter) 53. Then, after a signal having been output from the image pickup device 54 is converted by the A/D converter 56 through the circuit 55 processing the image pickup signal, the signal is input into the signal processing unit 57. An arithmetic operation of exposure is performed in the unit 59 controlling the whole and arithmetic operations based on the data. The brightness is judged based on the result of the photometry, and the unit 59 controlling the whole and arithmetic operations controls the diaphragm 53 according to the result of the judgment.

Next, high frequency components are taken out based on the signal output from the image pickup device 54, and an arithmetic operation of the distance to a subject is performed in the unit 59 controlling the whole and arithmetic operations. After that, the lens is driven to judge whether the lens is in-focus or not. When it is judged that the lens is not in-focus, the lens is again driven to perform the judgment. And after the confirmation of the in-focus state, main exposure is started. When the exposure ends, the image signal output from the solid state image pickup device 54 passes the circuit 55 processing the image pickup signal, and is subjected to the A/D conversion of the A/D converter 56. Then, the converted signal passes the signal processing unit 57, and is written in the memory unit 60 by the unit 59 controlling the whole and arithmetic operations. After that, the data stored in the memory part 60 passes the I/F unit 61 controlling the recording medium to be recorded on the detachably attachable recording medium 62 such as a semiconductor memory or the like by the control of the unit 59 controlling the whole and arithmetic operations. Moreover, the data may be directly input into a computer or the like through the external I/F unit 63, and an image may be processed.

The timing generator 58 controls signals of FIG. 5 such as the potential $\phi$res, $\phi$tx, $\phi$sel $\phi$CtsFD, $\phi$Ctn, $\phi$CtsPD and the like. A thermometer 64 detects a temperature, and outputs a voltage according to the detected temperature to the unit 59 controlling the whole and arithmetic operations. The unit 59 controlling the whole and arithmetic operations and the timing generator 58 control the potential $\phi$tx of the transfer gate according to the temperature in the period from the timing T2 to T4, in which the photodiode PD is generating and storing carriers. That is, the unit 59 controlling the whole and arithmetic operations and the timing generator 58 control in the period from the timing T2 to T4 so that the potential of the region a may have the same height as the height of the potential of the region b. But, because the height of potential changes dependently on temperature, the unit 59 controlling the whole and arithmetic operations and the timing generator 58 can control the height of the potential of the region a to be the same height as that of the potential of the region b by controlling the potential $\phi$tx of the transfer gate according to the temperature.

Third Embodiment

Figure 7:
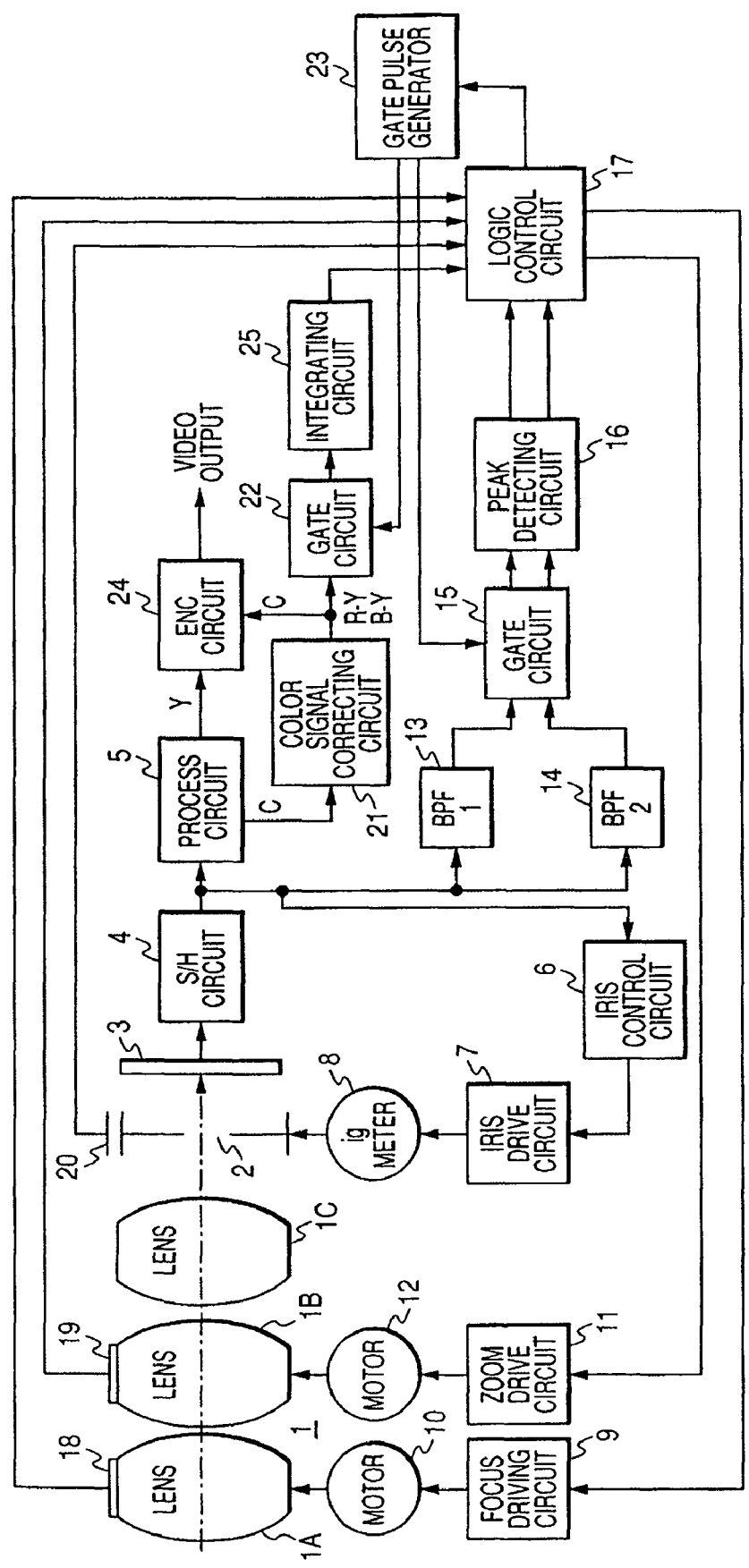
FIG. 7 is a block diagram showing a configuration example of a video camera according to a third embodiment of the present invention.

FIG. 7 is a block diagram showing a configuration example of a video camera according to a third embodiment of the present invention. Based on FIG. 7, an embodiment in the case where the image pickup device of the first embodiment is applied to a video camera is described in full detail.

A reference numeral 1 denotes a photographing lens equipped with a focus lens 1A for performing a focus adjustment, a zoom lens 1B performing a zoom operation, and a lens 1C for image formation. A reference numeral 2 denotes a diaphragm and shutter. A reference numeral 3 denotes an image pickup device performing the photoelectric conversion of a subject image formed as an image on the image pickup surface thereof to convert the subject image into an electric image pickup signal. A reference numeral 4 denotes a sample hold circuit (S/H circuit) which performs the sample hold of the image pickup signal output from the image pickup device 3 and further amplifies the level. The S/H circuit 4 outputs an image signal.

A reference numeral 5 denotes a process circuit which performs predetermined processing such as a gamma correction, a color separation, blanking processing and the like to the image signal output from the sample hold circuit 4. The process circuit 5 outputs a luminance signal Y and a chroma (chrominance) signal C. The chroma signal C output from the process circuit 5 receives the corrections of white balance and color balance by a color signal correcting circuit 21, and the corrected signal is output as color difference signals R-Y and B-Y.

Moreover, the luminance signal Y output from the process circuit 5 and the color difference signals R-Y and B-Y output from the color signal correcting circuit 21 are modulated by an encoder circuit (ENC circuit) 24, and are output as a standard television signal. And the standard television signal is output a not shown video recorder, or an electronic view finder such as a monitor electronic view finder (EVF).

Subsequently, a reference numeral 6 denotes an iris control circuit, which controls an iris drive circuit 7 based on the image signal supplied from the sample hold circuit 4 to automatically control an ig meter 8 in order to control the opening quantity of the diaphragm 2 so that the level of the image signal may take a fixed value of a predetermined level.

Reference numerals 13 and 14 denote band path filters (BPF) having different band limiting extracting high frequency components required for in-focus detection from the image signals output from the sample hold circuit 4. The signals output from the first band path filter 13 (BPF 1) and the second band path filter 14 (BPF 2) are gated by each of a gate circuit 15 and a focus gate frame signal, and the peak values of the gated signals are detected and held by a peak detecting circuit 16 to be input into a logic control circuit 17. Each of the peak values is called as a focus voltage, and a focus is adjusted by means of the focus voltage.

Moreover, a reference numeral 18 denotes a focus encoder detecting a movement position of the focus lens 1A. A reference numeral 19 denotes a zoom encoder detecting a focus distance of the zoom lens 1B. A reference numeral 20 denotes an iris encoder detecting the opening quantity of the diaphragm 2. The detection values of these encoders are supplied to the logic control circuit 17 performing system control.

The logic control circuit 17 performs in-focus detection to a subject to perform focus adjustment based on the image signal corresponding to a set in-focus detection region. Specifically, the logic control circuit 17 first captures the peak value information of the high frequency components supplied from each of the band path filters 13 and 14. And for driving the focus lens 1A to a position where the peak value of the high frequency components becomes the maximum, the logic control circuit 17 supplies control signals of the focus motor 10 such as the rotation direction, the rotation speed and the rotation/stop to the focus driving circuit 9 to control the focus drive circuit 9.

A zoom drive circuit 11 rotates a zoom motor 12 when zoom is instructed. When the zoom motor 12 rotates, the zoom lens 1B moves and zoom is performed.

As described above, according to the first to the third embodiments, the transfer gate control unit (e.g. the timing generator 58 in FIG. 6) controls the potential $\phi$tx of the transfer gate so that a part of the carriers overflowing from the photodiode PD flows into the floating diffusion region FD in the period from the timing T2 to T4 in which the photodiode PD is generating and storing the carriers. At this time, the transfer gate control unit may be formed on the same chip as that of the solid image pickup device.

Moreover, in FIG. 4, the pixel signal generating unit of FIG. 4 generates a pixel signal according to the carriers stored in the photodiode PD and the carriers having overflowed from the photodiode PD into the floating diffusion region FD.

Thereby, the ratio of the carriers flowing into the floating diffusion region FD among the carriers overflowing from photodiode PD can be controlled at high accuracy, and the dynamic range can be expanded as well as the image quality can be improved. Moreover, both the structures of the overflow from the photodiode PD into the floating diffusion region FD, and of the overflow from the photodiode PD to the drain B are the lateral overflow drain structures. Consequently, the difference of the temperature dependence of them can be reduced, and the ratio of the quantities of the carriers overflowing into the both can be easily kept to a fixed value by controlling the potential of the transfer gate.

Incidentally, any of the embodiments described is only an example of the concretization at the time of implementing the present invention, and the technical sphere of the present invention should not be interpreted to be limited by the embodiments. That is, the present invention can be implemented in various modes without departing from the technical sprit or the principal features thereof.

This application claims priority from Japanese Patent Application No. 2005-008123 filed Jan. 14, 2005, which is hereby incorporated by reference herein.

What is claimed is:

1. An image pickup device, comprising:
    a photoelectric conversion unit, which generates carriers by photoelectric conversion and which accumulates a part of said carriers;
    a floating diffusion region;
    a transfer transistor for transferring said part of said carriers into said floating diffusion region;
    an element isolation barrier surrounding said photoelectric conversion unit and including an impurity region that can be a barrier for said carriers;
    a reset transistor, which resets said floating diffusion region;
    a lateral direction overflow drain including an impurity region disposed between said photoelectric conversion unit and said drain and having an impurity density lower than that of said element isolation barrier;
    a transfer gate unit, which controls a gate voltage of said transfer transistor to be any of a first gate voltage, a second gate voltage, and a third gate voltage, wherein said first gate voltage is a voltage at which said transfer transistor is turned on and said part of said carriers is transferred, said second gate voltage is a voltage at which said transfer transistor is turned off, and said third gate voltage is between said first gate voltage and said second gate voltage and causes a remaining part of said carriers other than said part of said carriers to be divided into said floating diffusion region and said lateral direction overflow drain; and
    a pixel signal generating unit, which generates a pixel signal based on at least said remaining part of said carriers that have been transferred into said floating diffusion region in a period in which said gate voltage is controlled to be said third gate voltage.

2. An image pickup device according to claim 1, wherein said transfer gate unit controls said third gate voltage of said transfer gate according to an amplification degree of said pixel signal corresponding to an ISO speed.

3. An image pickup device according to claim 1, wherein said transfer gate unit controls said third gate voltage of said transfer gate so that a height of a potential barrier under said transfer gate between said photoelectric conversion unit and said floating diffusion region is a lowest height among heights of potential barriers enclosing said photoelectric conversion unit.

4. An image pickup device according to claim 1,
    wherein said device further comprises a plurality of photoelectric conversion units, and
    wherein a potential barrier of said impurity region, having an impurity density lower than that of said element isolation barrier, is lower than a potential barrier of said element isolation barrier, between one of said plurality of photoelectric conversion units and an adjacent photoelectric conversion unit.

5. An image pickup device according to claim 4, wherein said transfer gate unit controls said third gate voltage of said transfer gate so that a potential barrier under said transfer gate may have a same height as that of said potential barrier of said impurity region, having an impurity density lower than that of said element isolation barrier, between said photoelectric conversion unit and said drain.

6. An image pickup device according to claim 5, wherein said height of said potential barrier under said transfer gate and said potential barrier of said impurity region, having an impurity density lower than that of said element isolation barrier, between said photoelectric conversion unit and said drain, are lower than heights of potential barriers enclosing said photoelectric conversion unit.

7. An image pickup device according to claim 1, wherein said transfer gate unit controls said third voltage of said transfer gate according to a temperature.

8. An image pickup device according to claim 1, wherein said image pickup device is incorporated in a camera that includes:
    a lens for focusing an optical image on said image pickup device; and
    a diaphragm for changing a light quantity passing through said lens.

9. An image pickup device according to claim 1, further comprising:
    a capacitor for holding a signal based on carriers accumulated in said photoelectric conversion unit;
    a capacitor for holding carriers held by said floating diffusion region; and
    a capacitor for holding a signal based on a predetermined potential at which said floating diffusion region is reset.

10. An image pickup device according to claim 1, further comprising an amplifier for amplifying a signal based on said carriers generated by photoelectric conversion in said photoelectric conversion unit, wherein a gain value of said amplifier is adjusted according to an ISO speed.

11. The image pickup device according to claim 9, further comprising:
    a first amplifier, which amplifies an accumulated part of said carriers;
    a second amplifier, which amplifies a transferred part of said carriers; and
    an adder, which adds output signals of said first amplifier and said second amplifier to output said pixel signal.

* * * * *